United States Patent [19]

Hirata

[11] Patent Number: 5,034,599
[45] Date of Patent: Jul. 23, 1991

[54] IC CARD READER/WRITER HAVING A SHORT-CIRCUIT DETECTION CAPABILITY

[75] Inventor: Hiroharu Hirata, Tokyo, Japan

[73] Assignee: Oki Electric Industry Co., Ltd., Tokyo, Japan

[21] Appl. No.: 414,517

[22] Filed: Sep. 29, 1989

[30] Foreign Application Priority Data

Oct. 11, 1988 [JP] Japan .................. 63-132507[U]

[51] Int. Cl.⁵ .............................................. G06K 7/00
[52] U.S. Cl. .................................... 235/438; 235/441; 235/492
[58] Field of Search .................... 235/441, 492, 438

[56] References Cited

U.S. PATENT DOCUMENTS 4,109,161 8/1978 Iijima .
4,785,166 11/1988 Kushima ............................. 235/441
4,812,634 3/1989 Ohta et al. ......................... 235/492

FOREIGN PATENT DOCUMENTS 83215  7/1083 European Pat. Off. .
213046  3/1987 European Pat. Off. .
2589603  5/1987 France .
289480   5/1987 Japan .
157984   7/1987 Japan .

Primary Examiner—David Trafton
Attorney, Agent, or Firm—Spencer & Frank

[57] ABSTRACT

An IC card reader/writer has a short-circuit detector for determining, when an IC card is inserted in the reader/writer, whether or not any of connecting terminals for feeding a current to the IC card is short-circuited, and producing a resultant signal representative of the result of determination. A control is responsive to the resultant signal for performing, when the resultant signal does not indicate short-circuit, control such that the current is fed to the IC card via the connecting terminals. A reference voltage generator generates a reference voltage, while the short-circuit detector determines whether any of the connecting terminals is short-circuited or not by using the generated reference voltage.

10 Claims, 2 Drawing Sheets

IC CARD READER/WRITER HAVING A SHORT-CIRCUIT DETECTION CAPABILITY

BACKGROUND OF THE INVENTION

1. Field of the Invention

The present invention relates to an apparatus for reading and writing information in an IC (Integrated Circuit) card storage and, more particularly, to an IC card reader/writer having a capability of detecting a short-circuit of the IC card circuitry when it is loaded with the card.

2. Description of the Prior Art

An IC card reader/writer capable of detecting a short-circuit between contact pins thereof and ground potential so as to eliminate faults ascribable to the short-circuit has been proposed, as disclosed in Japanese Patent Laid-Open Publication No. 157984/1987 by way of example.

Referring to FIG. 2, a prior art IC card reader/writer with the above capability is shown specifically. As shown, the IC card reader/writer, generally 20, is made up of a card transport section 20A for transporting an IC card 10 into and out of the reader/writer 20, and a read/write section 20B for reading or writing data in the circuitry of the IC card 10 as needed. When the IC card 10 is inserted in the reader/writer 20, the card transport section 20A sets up electrical connection between terminals 13a to 13f of the IC card 10 and contact pins 21a to 21f which are incorporated in the card transport section 20A.

On the insertion of the IC card 10 in the reader/writer 20, the card read/write section 20B checks the terminals 13a to 13f of the IC card 10 for a short-circuit. If the card read/write section 20B does not find any short-circuit, it starts feeding a current to the IC card 10 so as to perform read-out, write-in or similar processing. In this sense, the card read/write section 20B plays the role of a control. The read/writer section 20B has a power source 22 for feeding a current to the IC card 10 as mentioned, a microcomputer 23 for effecting various kinds of control, power source switches 24 and 25, tristate buffers 27–30, a switch driver 31, an AND gate 32, etc. These components of the read/write section 20B are interconnected as shown in FIG. 2.

The AND gate 32 serves to determine whether or not a short-circuit has occurred on the insertion of the IC card 10 in the reader/writer 20. Specifically, the AND gate 32 has five input terminals which are individually connected to the contact pins 21a to 21d and 21f. The output terminal of the AND gate 32 is connected to the control 23. The input terminals of the AND gate 32 and the contact pins 21a to 21d and 21f are individually biased to a predetermined potential by pull-up resistors 31a to 31d and 31f.

In operation, when a power switch, not shown, of the IC card reader/writer 20 is turned on, the microcomputer 23 delivers its output to the switch driver 31 for thereby turning off the power source switches 24 and 25. Then, the tristate buffers 27 to 30 are each brought to a high-impedance state, i.e., an OFF state. In this condition, the reader/writer 20 awaits the insertion of the IC card 10. When the IC card 10 is inserted in the card transport section 20A, its terminals 13a to 13f are individually brought into electrical contact with the contacts 21a to 21f of the card transport section 20A. Thereafter, the microcomputer 23 determines whether the output of the AND gate 32 is in a high level "H" or in a low level "L". Here, the output of the AND gate 32 will be "H" if none of the contact pins 21a to 21d and 21f is short-circuited to the contact pin 21e which is adapted for the ground potential Vss, while it will be "L" if any of the contact pins 21a to 21d and 21f is short-circuited.

When the output of the AND gate 32 is "H", the control 23 turns the power supply switches 24 and 25 to an ON state via the switch driver 31. Then, the control 23 causes the tristate buffers 27 to 30 to switch into an ON state so that data may be read out or written in the IC card 10 via the contact pin 21c and terminal 13c.

On the other hand, when the output of the AND gate 32 is "L", the control 23 executes processing for driving the IC card 10 out of the card reader/writer 20 while maintaining the power source switches 24 and 25 and tristate buffers 27 to 30 in an OFF state. Hence, when the contacts 21a to 21f, especially, the contacts 21d and 21f adapted for power source potential and the contact 21e adapted for ground potential, are short-circuited to each other, the supply of power is interrupted by the power source switches 24 and 25. This is successful in eliminating damage to and malfunction of the card reader/writer 20 and IC card 10. It is to be noted that the short-circuit discussed above will occur when a flat piece of iron or similar conductor is intentionally inserted in the card reader/writer 20 or when impurities are deposited on the contacts 21a to 21f, for example.

The prior art IC card reader/writer 20 has some problems left unsolved, as follows. Generally, the power source Vcc available with the IC card 10 is limited with respect to the allowable range of consumption current Icc, e.g. up to 200 milliamperes as prescribed by ISO (International Organization for Standardization) standards. Hence, assuming that the IC card 10 has a consumption current Icc of 200 milliamperes, the input to the AND gate 32 cannot be guaranteed (i.e., the output of the AND gate 32 cannot be "H" even though a short-circuit to the ground potential Vss is absent) unless the pull-up resistors 31a to 31d and 31f have a resistance as small as about 10 ohms so as to maintain the threshold potential for detection at the AND gate 32 at the transistor-transistor logic (TTL) level. Pull-up resistors 31a to 31d and 31f each having such a high resistance cannot be implemented without using bulky resistors the wattage of which is as high as 2 watts to 3 watts, resulting in an increase in the overall size of the IC card reader/writer 20.

Another problem with the pull-up resistors 31a to 31d and 31f having a low resistance as stated above is that a relatively large current is apt to flow through the contact pins 21a, 21b and 21c also, via their associated pull-up resistors 31a, 31b and 31c. Such a current is liable to disturb data stored in a memory which is built in the IC card 10 and/or to damage a microcomputer which is also built in the card 10.

SUMMARY OF THE INVENTION

It is therefore an object of the present invention to provide and IC card reader/writer which is easy to miniaturize and eliminates the malfunction of and damage to an IC card.

The IC card reader/writer of the present invention has a short-circuit detector for determining, when an IC card is inserted in the reader/writer, whether or not any of connecting terminals for feeding a current to the IC card is short-circuited, and producing a resultant signal representative of the result of such determination. A control is responsive to the resultant signal for performing, when the signal does not indicate short-circuit, control such that the current is fed to the IC card via the connecting terminals. A reference voltage generator generates a reference voltage, while the short-circuit detector determines whether any of the connecting terminals is short-circuited or not by using the generated reference voltage.

In accordance with the present invention, a detecting voltage is applied to the power source terminals of the IC card after the insertion of the card. This prevents the detecting voltage from being applied to signal terminals of the IC card and thereby frees the card from the adverse infulence of such a voltage. With the present invention, it is possible to use a relatively low detecting voltage which is desirable for the miniaturization of the overall reader/writer configuration.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1:
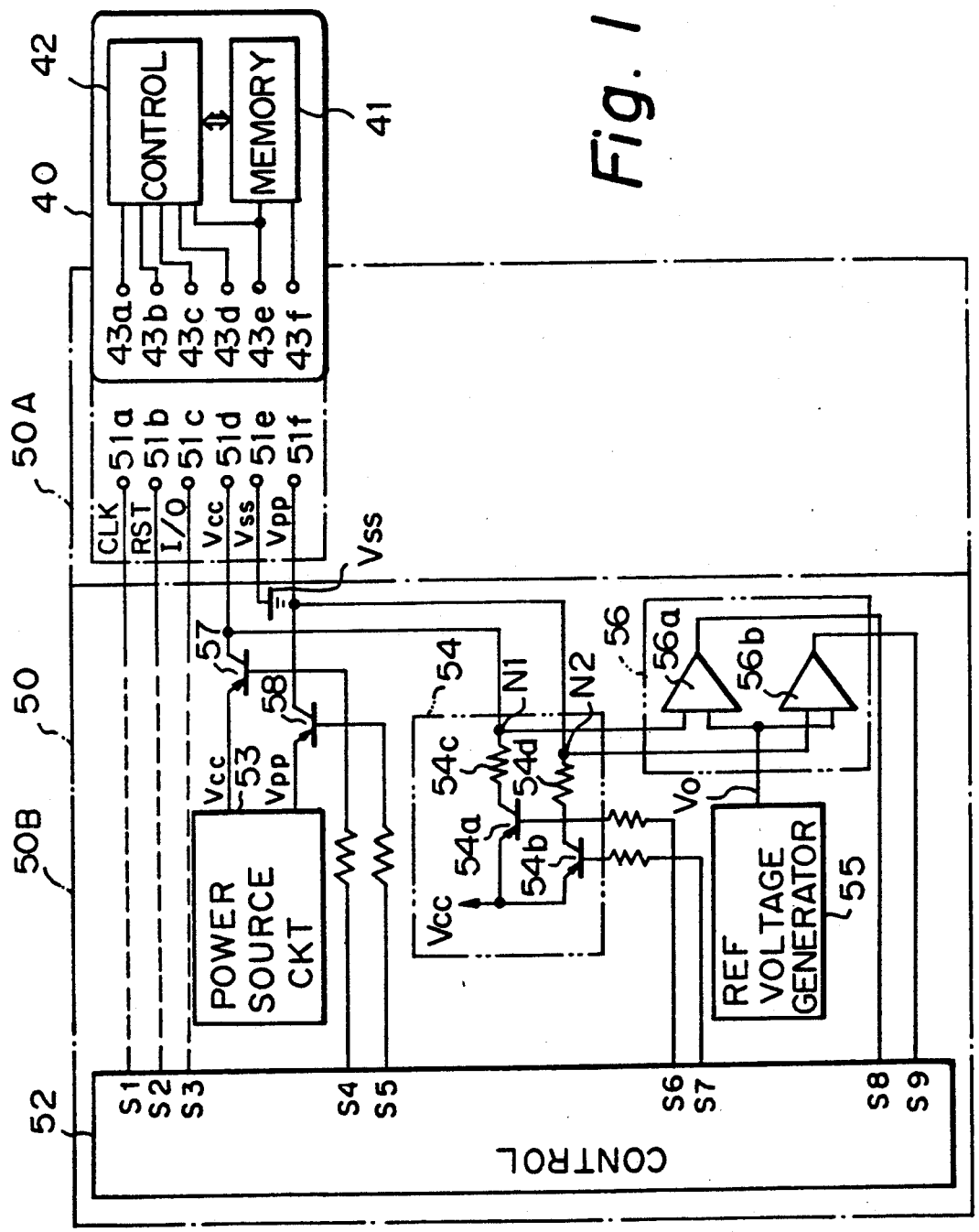
FIG. 1 is a schematic block diagram showing an embodiment of the IC card reader/writer in accordance with the present invention.
Figure 2:
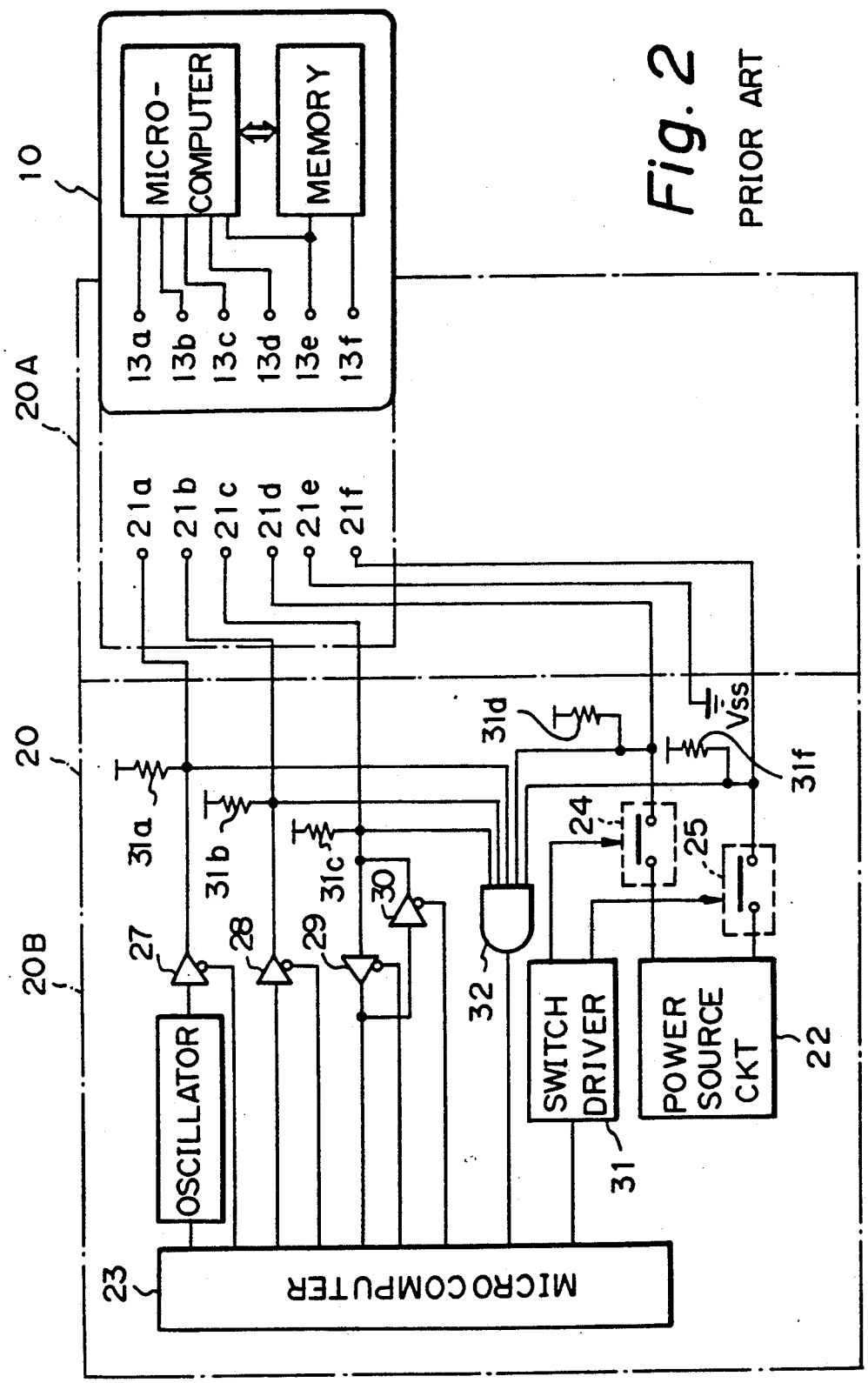
FIG. 2 is a schematic block diagram showing a prior art IC card reader/writer.

Referring to FIG. 1 of the drawings, an IC card reader/writer embodying the present invention is shown and generally designated by the reference numberal 50. An IC card 40 usable with the IC card reader/writer 50 has therein a memory 41 which is implemented by an EEPROM (Electrically Erasable and Programmable ROM), and a control 42 for controlling the reading and writing operations associated with the memory 41. The IC card 40 further has a terminal 43a assigned to a clock signal CLK, a terminal 43b assigned to a reset signal RST, a terminal 43c for the input and output of data, a terminal 43d for an operating voltage Vcc, a terminal 43e for the ground potential Vss, and a terminal 43f for a memory write-in voltage.Vpp. These terminals 43a to 43f may be so positioned as to show themselves on the other periphery of the IC card 40.

The IC card reader/writer 50 is generally made up of a card transport section 50A for transporting the IC card 40 into and out of the reader/writer 50, and a card read/write section 50B for reading and writing data in the card 40. The card transport section 50A has contact pins 51a to 51f which are respectively engageable with the terminals 43a to 43f of the IC card 40. Specifically, the terminals 51a to 51f are respectively adapted for a clock signal CLK, a reset signal RST, data input/output, operating voltage Vcc, ground potential or reference potential Vss, and memory write-in power source Vpp. Although not shown in the figure, the card transport section 50A includes therein feed rollers for the transport of the IC card 40, a motor for driving the feed rollers in a rotary motion, a sensor responsive to the IC card 40, etc.

The card read/write section 50B has a microcomputer or similar control 52 which governs the entire reader/writer 50 by feeding and receiving signals S1 to S9. A power source circuit 53 generates the operating voltage Vcc and memory write-in voltage Vpp previously mentioned. A voltage applying circuit or check voltage application means 54 generates a voltage for detection, or detecting voltage, which will be described. A reference voltage generator 55 generates a reference voltage $V_0$ which will also be described. The voltage applying circuit 54 cooperates with a comparing circuit or short circuit detection means 56 to constitute a detector which is responsive to short-circuits.

The control 52 has control signal terminals S1 to S3 which are respectively connected to the contact pins 51a to 51c via individual tristate buffers, not shown. The power source circuit 53 is connected to the contact pins 51d and 51f via power source switches 57 and 58 which are implemented by PNP transistors, for example. More specifically, the power source switches 57 and 58 are respectively connected to the control signal terminals S4 and S5 to be turned on and off in response to the associated control signals S4 and S5. The voltage applying circuit 54 is constituted by switching elements 54a and 54b which are comprised of PNP transistors, and resistors or loads 54c and 54d. The switching elements 54a and 54b are respectively connected to the control signal terminals S6 and S7 of the control 52 via associated resistors and turned on and off by the control signals S6 and S7. The switching element 54a and resistor 54c are connected in series between the power source Vcc and the contact pin 51d, while the switching element 54b and resistor 54d are connected in series between the power source Vcc and the contact pin 51f.

The comparing circuit 56 has two operational amplifiers (OP AMPs) 56a and 56b. The OP AMP 56a compares a potential appearing on the node N1 associated with the resistor 54c and the reference voltage $V_0$ which is applied thereto from the reference voltage generator 55, feeding the result of comparison to a control signal terminal S8 of the control 52 as a comparison signal S8. The other OP AMP 56b compares a potential appearing on a node $N_2$ associated with the resistor 54d and the reference voltage $V_0$, delivering the result of comparison to a control signal terminal S9 of the control 52 as a comparison signal S9. In order to detect a short-circuit of the node $N_1$ or that of the node $N_2$, the reference voltage $V_0$ is selected to be lower than a voltage which will appear when none of the nodes $N_1$ and $N_2$ is short-circuited, and higher than a voltage which will appear when any of them is short-circuited.

In operation, when a power switch, not shown, of the IC card reader/writer 50 is turned on, the control 52 turns the signals S4 to S7 to "H" to thereby cause the power source switches 57 and 58 and swtiching elements 54a and 54b into an OFF state, according to a program stored therein beforehand. Then, the reader/writer 50 becomes ready to receive the IC card 40. As soon as the IC card 40 is inserted in the card transport section 50A, the control 52 senses it and actuates the card transport section 50A to pull in the IC card 40 until the terminals 43a to 43f of the card 40 abut against the contact pins 51a to 51f, respectively. On the complete contact of the terminals 43a to 43f with the contact pins 51a to 51f, the control 52 momentarily turns the signals S6 and S7 to "L" for a certain short period of time such as several microseconds, thereby causing the switching elements 54a and 54b into an ON state.

While the switching elements 54a and 54b are in an ON state as stated above, the current from the power source Vcc is also fed to the contact pin 51d via the switching element 54a and resistor 54c and to the contact pin 51f via the switching element 54b and resistor 54d. In this condition, if any of the contact pins 51d and 51f associated with the power source Vcc has been short-circuited to the contact pin 51e assigned to the ground potential due to one cause or another, the current flowing through the resistor 54c or 54d causes the voltage to drop at the resistor 54c or 54d close to the power source Vcc (e.g. 5 volts). As the potential on the associated node N1 or N2 drops beyond the reference voltage $V_0$, the output signal S8 of the OP AMP 56a or the output signal S9 of the OP AMP 56b is varied. The control 52 senses the change in the output signal S8 or S9 either directly or by interruption and thereby detects the short-circuit. The control 52 then drives the card transport section 50A to return the IC card 40 to the outside without turning the power source switches 57 and 58 to an ON state.

On the other hand, when none of the contact pins 51d and 51f is short-circuited to the contact pin 51e, the potential appearing on each of the nodes N1 and N2 will be higher than the reference voltage $V_0$. In this condition, the control 52 decides that a short-circuit has not occurred in response to the output signals S8 and S9 of the OP AMPs 56a and 56b, respectively. The control 52, therefore, turns the signals S4 and S5 to "L" to thereby cause the power source switches 57 and 58 into an ON state. This applies the source voltages Vcc and Vpp to the IC card 40 by way of the switches 57 and 58, contact pins 51d and 51f, and terminals 43d and 43f, allowing the control 52 to read or write data in the IC card 40 via the contact pin 51c and terminal 43c by using its signal terminal S3. Thereafter, the control 52 actuates the card transport section 50A to drive the IC card 40 out of the card reader/writer 50. This is the end of the card reading or writing operation.

The specific embodiment shown and described has various unprecedented advantages as enumerated below.

(1) Since a short-circuit is detected by using the comparing circuit 56, the voltage appearing on any of the nodes $N_1$ and $N_2$, i.e., the necessary threshold voltage for detection can be reduced. This promotes the use of the resistors 54c and 54d having a relatively low resistance and, therefore, a relatively small size, whereby the overall reader/writer configuration is miniaturized.

(2) As the resistance of the resistors 54c and 54d is relatively low as stated in the above paragraph (1), the current flowing through the resistors 54c and 54d to the associated contact pins 51d and 51f is reduced to eliminate adverse influence of the current on the IC card 40.

(3) After the IC card has been fully driven into the card transport section 50A, the switching elements 54a and 54b are turned on to apply a detecting voltage to the contact pins 51d and 51f. Hence, the IC card 40 is not accurately positioned in the card transport section 50A, the detecting voltage is prevented from being applied to the signal terminals 43a to 43c. This is successful in freeing the IC card 40 from mulfunction and damage ascribable to such a voltage.

In summary, it will be seen that the present invention provides an IC card reader/writer which is miniature and does not adversely infulence the IC card because short-circuit detection is implemented by a voltage applying circuit and a comparing circuit, i.e., the comparing circuit needs only a relatively low detecting voltage. Further, after the insertion of the IC card, the detecting voltage is applied only to power source terminals of the IC card via switching elements and not to signal terminals of the card, thereby positively eliminating malfunction of and damage to the card.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention. For example, the memory 41 built in the IC card 40 may be implemented by any suitable non-volatile memory other than EEPROM or, if the card 40 has a solar cell or similar cell therein, even a RAM or similar volatile memory may be used which will then be backed up by the cell. The present invention is similarly practicable with an IC card which lacks the control 42.

The PNP transistors implementing the power source switches 57 and 58 and switching elements 54a and 54b may be replaced with NPN transistors or field effect transistors (FETs), for example. If desired, the IC card reader/writer 50 may be provided with an exclusive memory. The microcomputer playing the role of the control 52 is only illustrative and may be replaced with any other suitable control unit. It should be noted that the number and kind of the contact pins 51a to 51f shown and described are open to choice.

What is claimed is:

1. An Integrated Circuit (IC) card reader/writer having a short-circuit detection capability comprising:
   IC card reception/ejection control means for detecting insertion of the IC card into said IC card reader/writer and generating a detection signal when the card is detected;
   check voltage application means including a load, said check voltage application means applying a detecting voltage to a power source terminal of the IC card through said load for a short period of time on the order of several microseconds in response to the detection signal generated by said IC card reception/ejection control means; and
   short-circuit detection means for detecting the presence of a short-circuit in the power source terminal of the IC card based on a voltage drop across said load in said check voltage application means, said short-circuit detection means generating a control signal for ejecting said IC card when a short-circuit is detected.

2. An IC card reader/writer according to claim 1, wherein said check voltage application means further comprises a switching element connected in series with said load, said switching element being turned on for said short period of time.

3. An IC card reader/writer according to claim 1, wherein said short-circuit detection means comprises:
   a reference voltage generator for generating a reference voltage; and
   a comprising circuit for comparing said reference voltage to voltage across said load, said comparing circuit generating a control signal for ejecting said IC card when the potential difference between said reference voltage and the voltage across said load reaches a predetermined value.

4. An IC card reader/writer according to claim 2, wherein said switching element in said check voltage application means comprises a PNP transistor.

5. An IC card reader/writer according to claim 2, wherein said switching element in said check voltage application means comprises an NPN transistor.

6. An IC card reader/writer according to claim 2, wherein said switching element of said check voltage application means comprises a field effect transistor.

7. An IC card reader/writer according to claim 3, wherein said comparing circuit comprises an operational amplifier having one input terminal connected to said reference voltage generator, another input terminal connected to said load and an output terminal connected to said IC card reception/ejection control means.

8. An integrated circuit card reader/writer for detecting a short circuit in an intregated circuit card comprising:
- a card transport section having operating and reference voltage contact pins, said card transport section selectively receiving and ejecting an integrated circuit card having operating and reference voltage terminals for mating with said operating and reference voltage contact pins; and
- a card read/write section including
  control means;
  a voltage applying circuit, said voltage applying circuit including a switching element and a resistor connected between a voltage source and said operating voltage contact pin, said switching element being momentarily switched to an ON state by a control signal from said control means when the contact pins of said card transport section mate with the terminals of said integrated circuit card thereby momentarily applying a voltage to the operating voltage contact pin of said card transport section and to the operating voltage terminal of said integrated circuit card; and
- a comparing circuit having a first input coupled to said operating voltage contact pin, a second terminal coupled to a reference voltage source and an output coupled to said control means, the output of said comparing circuit having a first value when the difference between the voltage on said contact pin and the voltage of said reference voltage source has a first value indicating that the operating and reference voltage contact pins are short circuited to each other, and a second value when said operating and reference voltage contact pins are not short-circuited to each other, said control means ejecting said integrating circuit card when a signal having said first value is received from said comparing circuit.

9. An integrated card circuit reader/writer according to claim 8 wherein said resistor is interposed between said switching element and said operating voltage contact pin.

10. An integrated card circuit reader/writer according to claim 8 which further comprises a power source switch coupling said voltage source to said operating voltage contact pin, said power source switch being switched to an ON state by said control means when it has been determined by said control means that said operating voltage contact pin has not been short-circuited to said reference voltage contact pin.

* * * * *

UNITED STATES PATENT AND TRADEMARK OFFICE
CERTIFICATE OF CORRECTION

PATENT NO. :       5,034,599
DATED      :       July 23rd, 1991
INVENTOR(S) :      Hiroharu HIRATA It is certified that error appears in the above-identified patent and that said Letters Patent is hereby corrected as shown below:

Col. 6, line 57:
Claim 3, line 5, change "a comprising circuit" to
  -- a comparing circuit --.

Col. 8, line 9:
Claim 9, line 1, change "An integrated card circuit" to
  -- An integrated circuit card --.

Col. 8, line 23:
Claim 10, line 1, change "An integrated card circuit" to
  -- An integrated circuit card --.

Signed and Sealed this

Eighteenth Day of May, 1993

Attest:

MICHAEL K. KIRK

*Attesting Officer*    Acting Commissioner of Patents and Trademarks